US009373590B1

(12) United States Patent
Interrante et al.

(10) Patent No.: US 9,373,590 B1
(45) Date of Patent: Jun. 21, 2016

(54) INTEGRATED CIRCUIT BONDING WITH INTERPOSER DIE

(71) Applicant: International Business Machines Corporation, Armonk, NY (US)

(72) Inventors: Mario J. Interrante, New Paltz, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/585,323

(22) Filed: Dec. 30, 2014

(51) Int. Cl.
*H01L 23/00* (2006.01)
*B23K 20/02* (2006.01)

(52) U.S. Cl.
CPC ............ *H01L 23/562* (2013.01); *B23K 20/026* (2013.01); *H01L 24/83* (2013.01); *H01L 2224/8382* (2013.01)

(58) Field of Classification Search
None
See application file for complete search history.

(56) References Cited

U.S. PATENT DOCUMENTS

| 4,927,697 | A | 5/1990 | Hill |
| 5,175,410 | A | 12/1992 | Freedman et al. |
| 5,633,535 | A | 5/1997 | Chao et al. |
| 6,631,078 | B2 | 10/2003 | Alcoe et al. |
| 7,161,249 | B2 | 1/2007 | Shim et al. |
| 8,053,284 | B2 | 11/2011 | Iruvanti et al. |
| 8,409,920 | B2 | 4/2013 | Pendse et al. |
| 8,941,236 | B2* | 1/2015 | Limaye ............ H01L 23/49816 257/737 |
| 2001/0035572 | A1* | 11/2001 | Isaak ................... H01L 23/3121 257/678 |
| 2009/0261465 | A1* | 10/2009 | Shinagawa ........ H01L 23/49833 257/686 |
| 2010/0171209 | A1* | 7/2010 | Tanie .................... H01L 23/481 257/686 |
| 2011/0084375 | A1 | 4/2011 | Eu et al. |
| 2014/0070423 | A1* | 3/2014 | Woychik ............... H01L 21/486 257/774 |
| 2014/0084453 | A1 | 3/2014 | Daubenspeck et al. |
| 2014/0159054 | A1* | 6/2014 | Otake ................... H01L 24/36 257/77 |
| 2014/0209666 | A1 | 7/2014 | Interrante et al. |

OTHER PUBLICATIONS

Hara et al., "Optimization for Chip Stack in 3-D Packaging", IEEE Transactions on Advanced Packaging, vol. 28, No. 3, Aug. 2005, pp. 367-376.

\* cited by examiner

Primary Examiner — Evren Seven
Assistant Examiner — Steven Christopher
(74) Attorney, Agent, or Firm — Isaac J. Gooshaw

(57) ABSTRACT

A method of bonding components is disclosed. One embodiment of such a method includes applying both heat and pressure to a stack of components that includes an interposer with a reduced degree of warpage. Reducing the distance between the interposer and a first component of the stack of the components until a spacer prevents further reduction of that space. Then, cooling the stack of components while the pressure is maintained such that the degree of warpage of the interposer remains reduced.

20 Claims, 5 Drawing Sheets

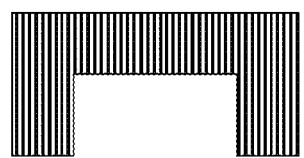
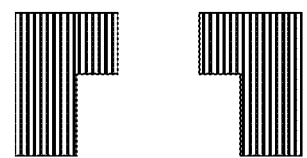
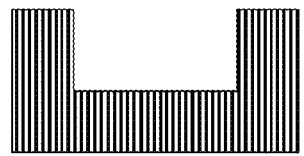
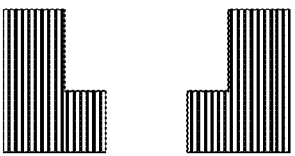
FIG. 5A
FIG. 5B
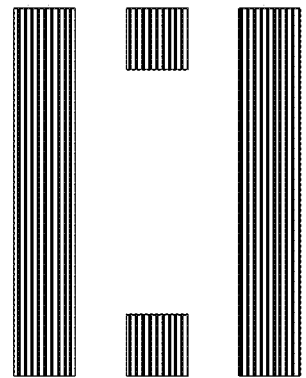
FIG. 5C

INTEGRATED CIRCUIT BONDING WITH INTERPOSER DIE

BACKGROUND OF THE INVENTION

The present invention relates generally to the field of integrated circuits, and more particularly to packaging of integrated circuits.

In electronics, a three-dimensional (3D) integrated circuit (IC) is a chip or combination of chips in which two or more layers of active electronic components are integrated both vertically and horizontally into a single circuit. 3D packaging saves space by stacking separate chips in a single package. A multi-chip module (MCM) is a specialized electronic package where multiple integrated circuits (ICs), semiconductor dies or other discrete components are packaged onto a unifying substrate, facilitating their use as a single component. The MCM itself will often be referred to as a "chip" in designs, thus illustrating its integrated nature. This packaging, known as System in Package (SiP) or Chip Stack MCM, does not integrate the chips into a single circuit. Instead, the chips in the package communicate using off-chip signaling, much as if they were mounted in separate packages on a normal circuit board.

A SiP is a number of integrated circuits enclosed in a single module (package). The SiP performs all or most of the functions of an electronic system, and are typically used inside a, for example, mobile phone, digital music player, etc. Dies containing integrated circuits may be stacked vertically on a substrate. In some cases, they are internally connected by fine wires that are bonded to the package. Alternatively, with a flip chip technology, solder bumps are used to join stacked chips together. SiP dies can be stacked vertically or tiled horizontally, unlike slightly less dense multi-chip modules, which place dies horizontally on a carrier. SiP connects the dies with standard off-chip wire bonds or solder bumps, unlike slightly denser three-dimensional integrated circuits which connect stacked silicon dies with conductors running through the die. Many different 3-D packaging techniques have been developed for stacking many more-or-less standard chip dies into a compact area.

An example SiP can contain several chips (such as a specialized processor, DRAM, flash memory) combined with passive components, for example resistors and capacitors, which are mounted on the same substrate. This means that a complete functional unit can be built in a multi-chip package, so that few external components need to be added to make it work. This is particularly valuable in space-constrained environments as it reduces the complexity of the package substrate and overall design.

SUMMARY

Embodiments of the present invention provide a method of bonding components.

A first embodiment of the method includes: applying both heat and pressure to a stack of components that includes an interposer with a degree of warpage that is reduced; reducing the distance between the interposer and a first component of the stack of the components until a spacer prevents further reduction of the distance between the interposer and the first component; and cooling the stack of components while the pressure is maintained such that the degree of warpage of the interposer remains reduced. Warpage may result, for example, from metal loading differences between the two sides of a given component.

A second embodiment of the method includes: applying both heat and pressure to a stack of components that includes an interposer with a degree of warpage that is reduced, an integrated circuit, and an organic laminate, wherein the interposer is between the integrated circuit and the organic laminate; reducing the distance between the interposer and the organic laminate until a spacer prevents further reduction of the distance between the interposer and the organic laminate; and cooling the stack of components while pressure is maintained on the stack of components such that the degree of warpage of the interposer remains reduced.

A third embodiment of the method includes: applying both heat and pressure to a stack of components that includes an interposer with a degree of warpage that is reduced, an integrated circuit that includes a plurality of quantities of solder that are diffusion bonded to the interposer, and a package substrate that is in contact with a plurality of quantities of solder of the interposer, wherein the interposer is between the integrated circuit and the package substrate, and wherein applying both heat and pressure to the stack of components causes a reflow of one or more quantities of solder of the integrated circuit and one or more quantities of solder of the interposer; reducing the distance between the interposer and the package substrate until a spacer prevents further reduction of the distance between the interposer and the package substrate when the spacer comes into contact with the interposer; and cooling the stack of components while pressure is maintained on the stack of components such that the degree of warpage of the interposer remains reduced.

BRIEF DESCRIPTION OF THE SEVERAL VIEWS OF THE DRAWINGS

FIGS. 5A through 5C show top-down views of three examples of spacers used in the processes of FIG. 3, in accordance with three embodiments of the present invention.

DETAILED DESCRIPTION

Figure 1A:
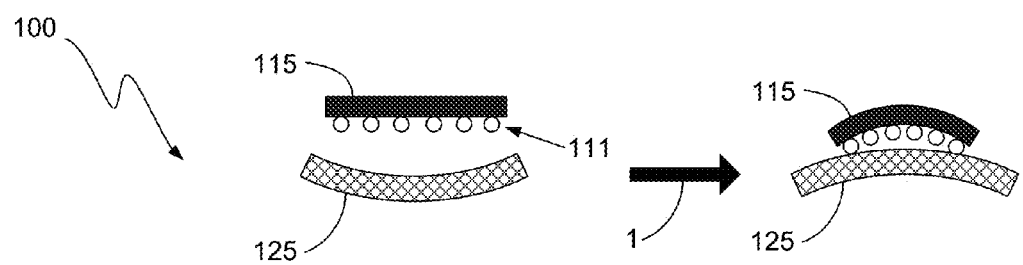
FIG. 1A illustrates a bonding process that bonds an interposer to a package substrate.

Circuit boards with multiple Very Large Scale Integrated (VLSI) circuit chips are called Multi-Chip Modules (MCM). The use of VLSI circuits presents interface problems relating to the interconnection of the integrated circuits to other circuits and the placement of the integrated circuits on a ceramic circuit board (MCM-C). As VLSI technology has advanced, the density of circuits on a single VLSI chip has increased and the necessary interconnection for VLSI chips has become increasingly difficult to achieve in a limited space.

There are two classes of three dimensional (3D) chips which are being developed. The first is known as 2½D where a so-called interposer is created. These include glass, organic and silicon based interposers. To provide connections between various chips and other components the use of interposers has become increasingly prevalent. In general, the interposer does not contain any active transistors, only interconnects (and perhaps decoupling capacitors), thus avoiding the issue of threshold shift. The chips are attached to the interposer by flipping them so that the active chips do not require any through silicon vias (TSVs) or through glass vias or (TGVs) to be created.

Typically, the active dies themselves do not have any TSVs or TGVs, but interposers do. This means that the active die can be manufactured without worrying about TSV exclusion zones or threshold shifts. The chips themselves are micro-bumped (i.e., have very small bumps of solder attached to input/output connection points), since they are not going to be conventionally wire-bonded out. These micro-bumps are bonded to corresponding connections points of the interposer. Often, there are metal layers of interconnect on or within the interposer, and TSVs/TGVs that pass through the interposer substrate and are bonded using flip-chip bumps to the package substrate. Generally, flip-chip bumps are similar to micro-bumps but are larger and more widely spaced.

In many interposer designs, a TSV/TGV is a via that passes from the front side of the wafer (typically connecting to one of the lower metal layers) through the wafer and out the back. TSVs and TGVs vary in diameter from 1 to 10 um, with a depth from 5 to 10 times the width. A hole is formed into the wafer of the interposer, lined with an insulator, and then filled with conductive material such as copper or tungsten. Finally the wafer is thinned to expose the backside of the TSVs. Note that this means that the wafer itself ends up merely 10-110 um thick. Silicon is brittle, so one of the challenges is handling the thin wafers during both the fabrication and when they have to be shipped to an assembly house. The wafer is often bonded to some more robust substrate (for example, glass or silicon) before thinning and, in some cases, may be separated again during assembly. The wafer is generally thinned using CMP (chemical mechanical polishing, similar to how planarization is done between metal layers in a normal semiconductor process) until the TSVs are almost exposed. More silicon is then etched away to reveal the TSVs themselves. In many cases, this completes the majority of the processes used to fabricate an interposer.

Certain ICs, memories in particular, have very similar or identical pinouts when used multiple times within systems. A carefully designed substrate can allow these dies to be stacked in a vertical configuration, making the resultant MCM's footprint much smaller (albeit at the cost of a thicker or taller chip). Since area is more often at a premium in miniature electronics designs, the chip-stack is an attractive option in many applications such as cell phones and personal digital assistants (PDAs). For example, after a thinning process, multiple dies are stacked to create a high capacity secure digital (SD) memory card.

Embodiments of the present invention recognize that defective chip connections in a package will result in a non-functionally packaged integrated circuit, even if other modules and connections in that same package are functional. Embodiments of the present invention recognize that silicon interposer warpage during the conventional reflow processes may result in non-wetting of solder bumps and/or bridging between solder joints, thereby decreasing the assembly yield. Embodiments of the present invention recognize that warpage becomes more significant when the chip size increases and the silicon interposer thickness decreases. Embodiments of the present invention recognize that the greater the degree of warpage of the interposer the more likely that there will be a break or discontinuation of connections between the interposer and one or more chips that are attached to it. Embodiments of the present invention provide a method to minimize warpage of the interposer through the user of a shim during the assembly process. Embodiments of the present invention provide a method of reducing breakage or discontinuation of connections between the interposer and one or more chips that are attached to it.

The present invention will now be described in detail with reference to the Figures.

FIG. 1A illustrates a bonding process, 100, that bonds interposer 115 to package substrate 125. In the examples used herein, package substrate 125 is a general substrate (for example, a glass/ceramic substrate, an organic laminate, or printed circuit board (PCB)) with connection pads (not shown) that line up with a given C-4 (Controlled Collapse Chip Connection) 111 (indicated using an arrow). Interposer 115 includes a group of C-4 111, which are quantities of solder that form electrical connection points for various wiring and other routing structures of interposer 115. In one embodiment, interposer 115 includes a through-silicon-via (TSV) that passes from the front side of the wafer (typically connecting to one of the lower metal layers) through the wafer and out the back. For ease of understanding, the "front" of an interposer is herein designated as the side that includes C-4 111.

As depicted in the left hand side of FIG. 1A, each of interposer 115 and package substrate 125 are not perfectly flat. Specifically, package substrate 125 is substantially bowed. Subsequently, interposer 115 and package substrate 125 are placed together (such that the front side of interposer 115 faces package substrate 125) and a reflow process (represented by arrow 1) takes place. Referring to the right side of FIG. 1A, after reflow, all of solder balls that form C-4 111 (of interposer 115) are not in contact with package substrate 125. In FIG. 1A, the center region of interposer 115 fails to come into proximity to package substrate 125 such that some of the C-4 111 fail to make physical contact with package substrate 125, which results in one or more open connections. Conversely, though not shown, some of the solder balls that form C-4 111 that are located closer to the edges of interposer 115 come too close to the laminate surface causing solder ball bridging or shorting.

Figure 1B:
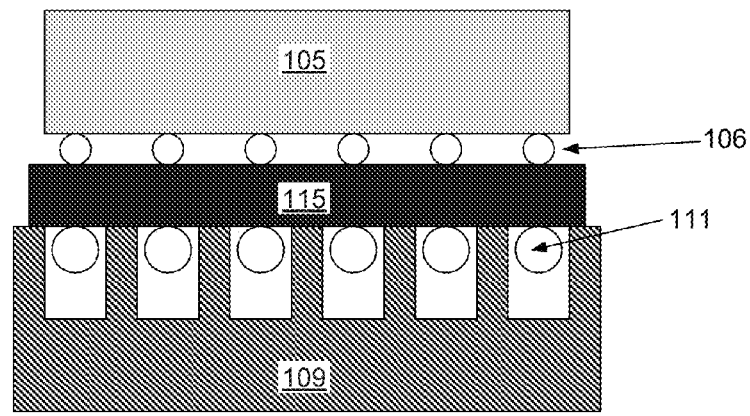
FIG. 1B illustrates a step in a bonding process to bond a top die to an interposer.

FIG. 1B illustrates a step in a bonding process to bond top die 105 (an integrated circuit) to interposer 115. In this example, interposer 115 has a degree of warpage (not shown) that causes interposer 115 to arch upward. In FIG. 1B, top die 105 and interposer 115 are shown as being bonded using a vacuum technique to prevent the warpage of interposer 115 to interfere with the formation of connections between interposer 115 and top die 105.

In FIG. 1B, interposer 115 was placed on vacuum device 109 and a vacuum applied. Vacuum device 109 includes one or more channels (not shown) that allow vacuum to be applied to each of C-4 111. As such, in this embodiment, vacuum device 109 actually represents not one, but two components. In this embodiment, the two components that comprise vacuum device 109 include i) a silicon substrate with channels to accept C-4 111 which is on ii) a vacuum plate that has channels that connect to at least some of channels of the silicon substrate. The application of vacuum resulted in the warpage of interposer 115 being reduced to below a threshold. In other words, the application of vacuum, by vacuum device 109 to interposer 115, flattened out interposer 115 as shown. Prior to this flattening, interposer 115 of FIG. 1B had a degree of warpage similar to that shown as the product of FIG. 1A (i.e., to the right of arrow 1) in which interposer 115 is bowed upward and away from package substrate 125.

In FIG. 1B, top die 105 was bonded to interposer 115 using a furnace reflow process and/or a thermal compression bonding process. The result of this process is shown in FIG. 1B. Note that top die 105 includes a group of quantities of solder that constitute a group of solder micro-bumps (bump array 106), which have a finer pitch and lower volume of solder than the solder bumps of C-4 111. In the case of top die 105, the group of solder balls constitute a controlled collapse chip connection (C-4) array. The solder balls of bump array 106 line up with connection pads (not shown) on the "back" side of interposer 115. As such, in the semiconductor structure shown/produced in FIG. 1B, the electrical connections of top die 105 are routed to the electrical pathways included in interposer 115. Note that the warpage of interposer 115 of FIG. 1B causes internal strain in interposer 115 when interposer 115 is flattened. However, because of the connections formed with top die 105, this warpage is reduced in degree, since the vacuum flattened interposer 115 before connections were formed between interposer 115 and top die 105. Therefore, after vacuum is released by vacuum device 109, interposer 115 has an increased degree of internal strain due to the forced flattening/reduced warpage, which is maintained by the connections between interposer 115 and top die 105. In other words the connections between interposer 115 and top die 105 prevent, at least to a degree, interposer 115 from relaxing back into the warped conformation that was present before the vacuum/flattening process was applied.

Figure 1C:
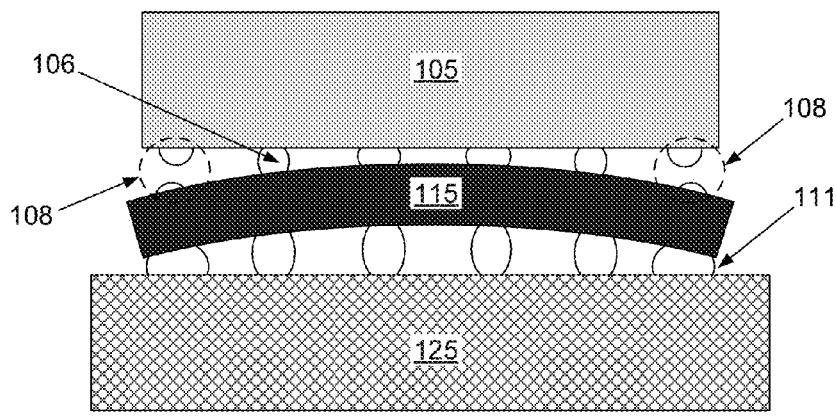
FIG. 1C illustrates broken connections between the top die and the interposer of FIG. 1B.

FIG. 1C, illustrates broken connections between interposer 115 and top die 105 (herein denoted broken bonds 108), which are indicated using dashed line circles, between top die 105 and interposer 115 of FIG. 1B. In this example, the semiconductor structure shown/produced in FIG. 1B (i.e., top die 105 and interposer 115 combination) is used in place of interposer 115 to the left of arrow 1 of FIG. 1A. When the combination of top die 105 and interposer 115 that resulted from the processes of FIG. 1B is attached to package substrate 125 using a reflow process (for example, like the reflow process represented by arrow 1 in FIG. 1A) the warpage of interposer 115 is no longer kept in check by the bonds between interposer 115 and top die 105, since the solder balls that made these connections soften due to heating. As such, interposer 115 relieves its internal strain by returning, at least to a point, to its previous warped conformation as described in the discussion of FIG. 1B. As a result, interposer 115 and top die 105 are separated farther apart from one another at their edges than at their centers, which breaks some of the connections formed by bump array 106. In some scenarios, even if these connections do not soften, interposer 115 and top die 105 are separated farther apart from one another at their edges when the warpage stress is too high. This can lead to decreased longevity of these connections. In FIG. 1C, there two broken bonds 108, which are indicated using arrows and dashed circles. Each broken bond 108 is a bond that was formed by the processes of FIG. 1B, but was subsequently broken during the processes of FIG. 1C. Further detail regarding this bond breakage, i.e., the formation of broken bond 108, is provided in the discussion of FIG. 2.

Figure 2:
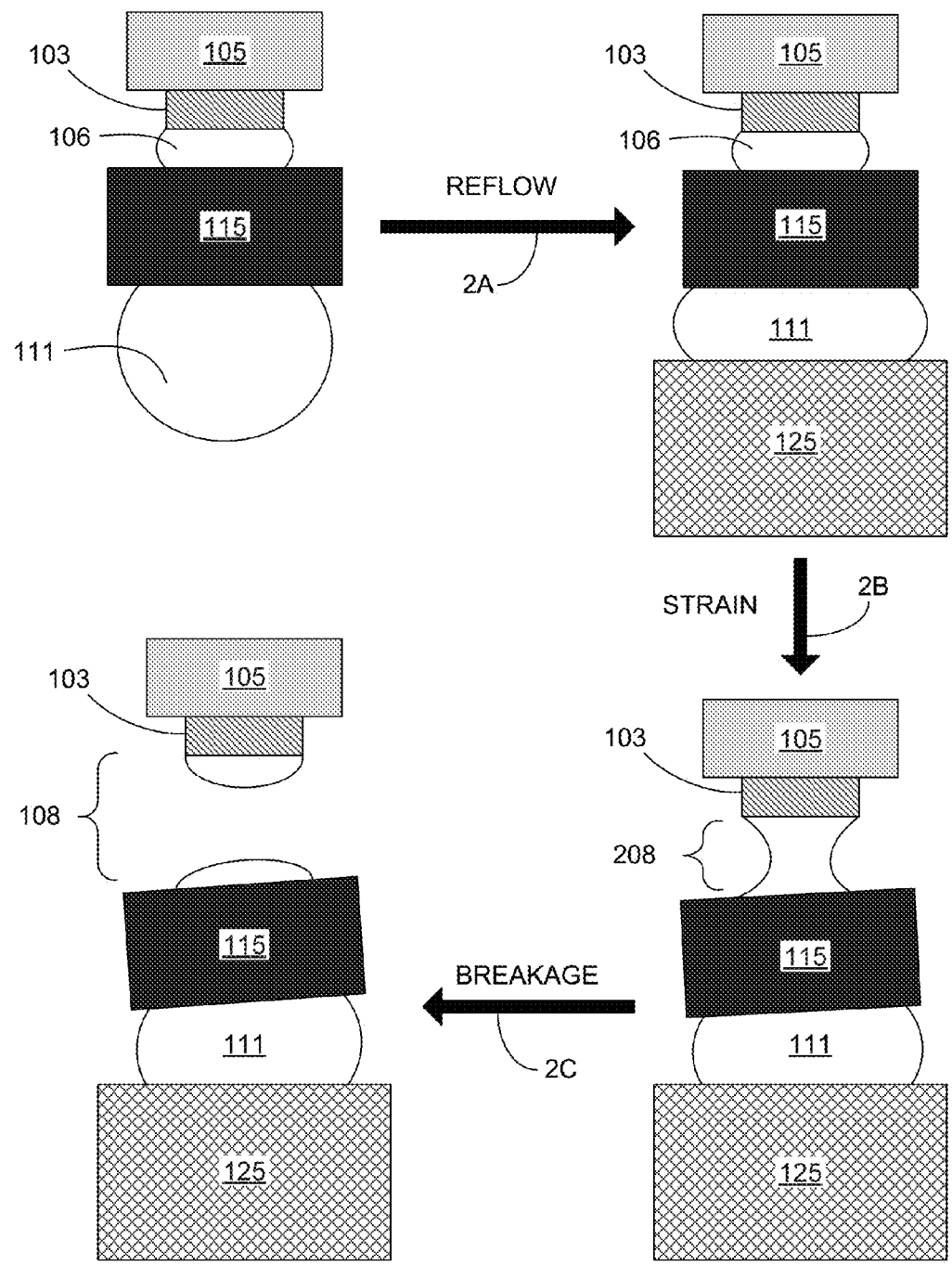
FIG. 2 illustrates a flow diagram illustrating the formation and breakage of various bonds between the top die, the interposer, and the package substrate of FIG. 1C.

FIG. 2 illustrates a flow diagram illustrating the formation and breakage of various bonds between top die 105, interposer 115, and package substrate 125 of FIG. 1C, in accordance with an embodiment of the present invention. FIG. 2 illustrates a connection pillar 103 composed of, for example, copper that connects a fine pitch solder ball of bump array 106 to top die 105. In this example, an outermost solder ball of bump array 106 is illustrated as the starting point. Note that this solder ball is one of the solder balls that becomes broken bond 108 as a result of the processes of FIG. 1C. The processes of FIG. 2 begin with the semiconductor structure shown/produced in FIG. 1B. A reflow process is then applied (indicated by arrow 2A) to bond the starting semiconductor structure to package substrate 125. However, as noted previously, the application of heat during the reflow process also heats up the bonds between top die 105 and interposer 115. This reduction in the strength of the bonds (i.e., increased malleability of the bonds) results in strain being relieved (as indicated by arrow 2B). In other words, interposer 115 relieves its internal strain by warping.

As shown in FIG. 2, the warping of interposer 115 results in the edge of top die 105 being moved farther away from interposer 115. This in turn begins to stretch the outermost solder ball of bump array 106, which results in the formation of stretched bond 208. As interposer 115 continues to move farther away from the edge of top die 105, stretched bond 208 continues to stretch until it breaks (as indicated by arrow 2C). As seen in the final product of FIG. 2, a broken bond 108 (indicated by a bracket) has formed from stretched bond 208.

Figure 3:
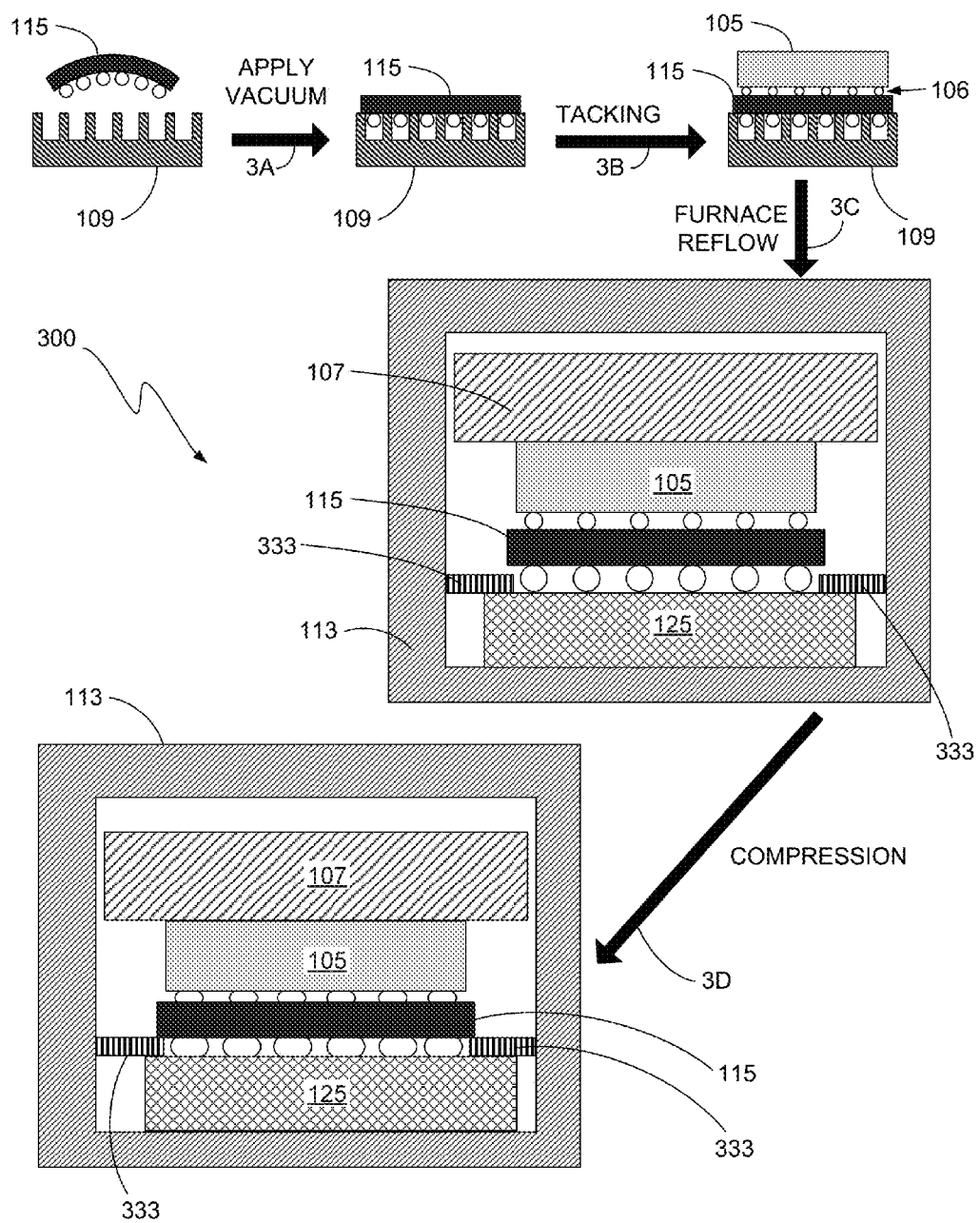
FIG. 3 illustrates a method for bonding a top die to an interposer and, the interposer to a package substrate while minimizing bond breakage therebetween, in accordance with an embodiment of the present invention.

FIG. 3 illustrates a method for bonding both top die 105 to interposer 115 and interposer 115 to package substrate 125, while minimizing bond breakage, in accordance with an embodiment of the present invention. The various processes and stages of fabrication of FIG. 3 are illustrated using labeled arrows, with each arrow representing a particular process, e.g., process 3A is illustrated as an arrow labeled 3A.

Similar to the process of FIG. 1B, interposer 115 is placed on a vacuum device 109 and vacuum is applied (denoted as arrow 3A) to reduce the warpage of interposer 115. Then top die 105 is placed on interposer 115 such that the solder bumps of bump array 106 line up with connection pads (not shown) on the "back" side of interposer 115. Next, a process of solid-state diffusion bonding is applied (denoted as arrow 3B) to cause bonds to form between top die 105 and interposer 115, which is denoted as "tacking".

Diffusion bonding is a solid-state welding technique used in metalworking, capable of joining similar and dissimilar metals. It operates on the materials science principle of solid-state diffusion, wherein the atoms of two solid, metallic surfaces intermingle over time under elevated temperature. Diffusion bonding is typically implemented by applying both high pressure and high temperature to the materials to be welded; it is most commonly used to weld "sandwiches" of alternating layers of thin metal foil and metal wires or filaments. Generally, diffusion bonding occurs in three simplified stages: i) before the surfaces completely contact, asperities (very small surface defects) on the two surfaces contact at the microscopic level and plastically deform, as these asperities deform, they interlink forming interfaces between the two surfaces; ii) elevated temperature and pressure causes accelerated creep in the materials, grain boundary diffusion and raw material migration and gaps between the two surfaces are reduced to isolated pores; and iii) material diffuses across the boundary of the abutting surfaces thereby creating a bond between the two surfaces.

In some embodiments, the solid-state diffusion bonding is an intermetallic compound bonding process.

Note that, in contrast to the process described in the description of FIG. 1B, which was a heat-driven plastic deformation, there is no full reflow of the solder balls since the solder balls are not heated to a sufficient temperature to allow heat-driven plastic deformation (i.e., the solder balls are not melted). In this case, the bonds that are formed are strong enough to maintain the alignment of top die 105 with interposer 115. As in FIG. 1B, the bonds between top die 105 with interposer 115 inhibit the return of interposer 115 to a warped state. For simplicity, top die 105 that is diffusion bonded with interposer 115 is hereafter referred to as a first semiconductor structure.

With top die 105 bonded to interposer 115 using diffusion bonds; the first semiconductor structure is placed on package substrate 125 in bonding device 113. As in the description of FIG. 1A, the first semiconductor structure is placed on package substrate 125 such that controlled collapse chip connections of C-4 111 are aligned with the connection pads of package substrate 125 (not shown). Note that bonding device 113, for example a mass reflow furnace or a chamber type reflow tool, includes weight 107 and spacers 333. In some embodiments, spacers 333 are composed of one or more pieces of kapton film. When bonding device 113 is activated (denoted as arrow 3C) it heats the first semiconductor structure and package substrate 125 to a temperature that allows heat-driven plastic deformation of both the solder bumps of bump array 106 and the solder balls of C-4 111. As such, both the solder bumps of bump array 106 and the solder balls of C-4 111 are subjected to a reflow process. Because weight 107 is pressing down, as the solder bumps of bump array 106 and the solder balls of C-4 111 soften, they are compressed (denoted as arrow 3D).

Figure 4A:
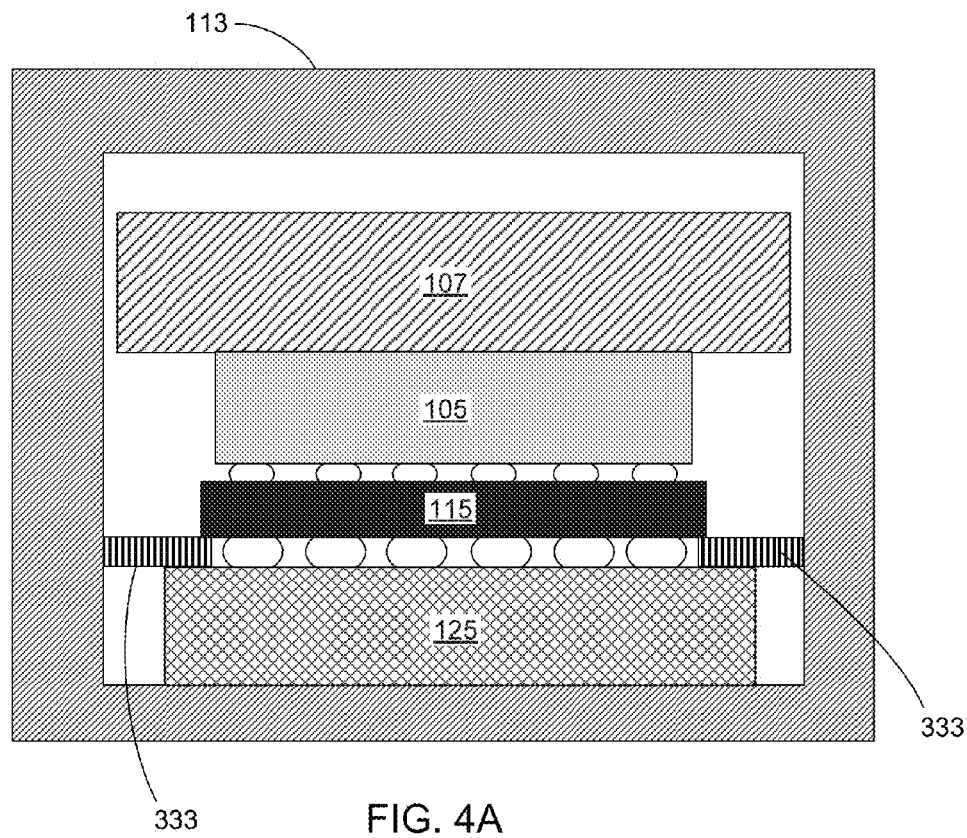
FIG. 4A, is an enlarged view of the compression process of FIG. 3, in accordance with an embodiment of the present invention.

However, in some embodiments, due to compositional differences, the solder bumps of bump array 106 and the solder balls of C-4 111 have different melting points. In such embodiments, the solder bumps of bump array 106 soften at a higher temperature that the solder balls of C-4 111. Therefore, the solder balls of C-4 111 soften first and due to the pressure supplied by weight 107, the solder balls of C-4 111 compress until the edge of interposer 115 comes to rest on spacers 333. In other embodiments, both the solder bumps of bump array 106 and the solder balls of C-4 111 have substantially similar melting points. In either case, spacers 333 prevent further reduction in the space between interposer 115 and package substrate 125. This is more clearly seen in FIG. 4A, which is an enlarged view of the compression process, in accordance with an embodiment of the present invention. As seen in FIG. 4A, spacers 333 prevent interposer 115 from flattening the solder balls of C-4 111 into a contiguous sheet of solder by preventing further reduction in the distance between interposer 115 and package substrate 125, which includes C-4 111.

Due to the complexity of illustrating the change in distance between interposer 115 and package substrate 125 during process 3D, illustrations of such distances are limited to visualizations of a beginning point and an ending point in FIG. 3. The product of process 3C shows spacers 333 between interposer 115 and package substrate 125, where spacers 333 are in contact with only package substrate 125. In other words, the product of process of 3C illustrates a first and larger distance (i.e., the beginning point) than that which results from process 3D. The product of process 3D shows spacers 333 in contact with both of interposer 115 and package substrate 125. In other words, the product of process of 3D illustrates a second and smaller distance between interposer 115 and package substrate 125 (i.e., the ending point) than that which resulted from process 3C. As such, FIG. 3 illustrates two distances, the first is a larger distance between interposer 115 and package substrate 125 in the product of process 3C, the second is a comparatively smaller distance between interposer 115 and package substrate 125 in the product of process 3D.

Figure 4B:
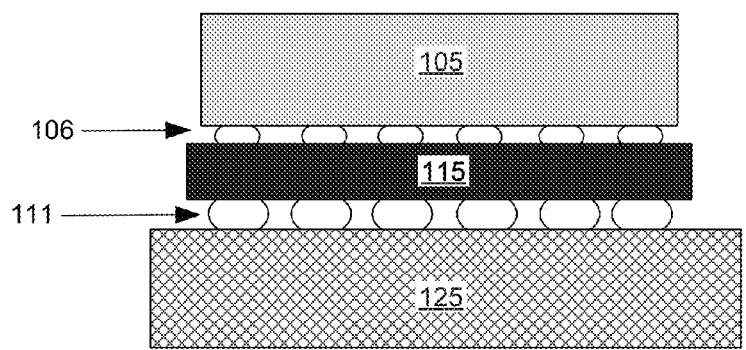
FIG. 4B shows an enlarged view of a semiconductor structure produced by the processes of FIG. 3, in accordance with an embodiment of the present invention.

As the temperature continues to increase, the solder balls of bump array 106 reflow. Once reflow completes, the resulting semiconducting structure, which includes top die 105 bonded to interposer 115 with reflowed solder bumps of bump array 106 and interposer 115 bonded to package substrate 125 with reflowed solder balls of C-4 111, is cooled. As such, interposer 115 of the resulting semiconductor structure (resulting from process 3D) retains the reduced degree of warpage of process 3A and 3B. In addition, because a) the solder bumps of bump array 106 are reflowed in a single process along with the solder balls of C-4 111 and, b) because interposer 115 retains the reduced degree of warpage, there is a reduced formation of broken bonds 108. This is more clearly seen in FIG. 4B, which shows an enlarged view of the resulting semiconductor structure that results from the processes of FIG. 3, in accordance with an embodiment of the present invention. As shown in FIG. 4B, there are no broken bonds 108 and no discernable warpage of either top die 105, interposer 115 or package substrate 125, i.e., they are not arched, bowed or otherwise out-of-plane with one another.

FIGS. 5A through 5C show top-down views of three examples of spacers 333, in accordance with three embodiments of the present invention. In general, there are many possible forms of spacers 333. In an embodiment, spacers 333 support the edges of interposer 115 such that spacers 333 prevent further reduction in the space between interposer 115 and package substrate 125. As such, as is understood by one skilled in the art, the exact number, shape, and orientation of spacers 333 varies in other embodiments.

In another embodiment, a second set of spacers 333 are used to prevent further reduction in the distance (i.e., the space) between top die 105 and interposer 115 by coming into contact with the edges of top die 105 as a result of the compression process (process 3D of FIG. 3).

In another embodiment, package substrate 125 includes the solder balls of C-4 111 instead of interposer 115 including the solder balls of C-4 111. In some embodiments, a first underfill material is applied after top die 105 is tacked to interposer 115, i.e., the first under-fill material is used to substantially fill the space between top die 105 and interposer 115. For example, the underfill material is an electrically-insulating adhesive. Then the reflow process described in FIG. 3 (process 3C) is applied to bond interposer 115 to the C-4 111 of package 125. A second underfill material is applied that substantially fills the space between interposer 115 and package 125. In an alternative embodiment, the first underfill material is not applied and the second underfill material is applied to fill the space between both top die 105 and interposer 115 and between interposer 115 and package 125 after the reflow process of FIG. 3.

In other embodiments, other processes are applied to further package the semiconductor structure described herein. For example, a layer of under-fill material is applied to fill the spaces between the solder balls of bump array 106 and the solder balls of C-4 111.

In some embodiments, the coefficient of expansion of the material comprising spacers 333 is matched to one or more of top die 105, interposer 115, and package substrate 125. As such, in these embodiments, spacers 333 are composed of a material that expands and contracts thereby maintaining a specific distance between one or more of top die 105, interposer 115, and package substrate 125, or another material/structure included in the processes of FIG. 3. For example, spacers 333 are composed of a material that expands and contracts at substantially the rate as the solder balls of C-4 111. In this example, as the product of process 3D (of FIG. 3) cools, strain is not induced in the cooling solder balls by the presence of spacers 333 being between interposer 115 and package substrate 125. Such strain may occur, for example, if the rate of thermal expansion of spacers 333 is higher than that of solder balls of C-4 111. In such a case, the solder balls would contract to a higher degree than spacers 333 during cooling but would be prevented from doing so by the presence of spacers 333. In other embodiments, the induction of strain during the cooling process is utilized to configure one or more materials included in the product. In these embodiments, the induction of strain yields materials/structures with different properties than would be present without that strain. In such embodiments, the coefficient of expansion of the material comprising spacers 333 is selectively mismatched to one or more of top die 105, interposer 115, and package substrate 125, or another material/structure included in the processes of FIG. 3.

The methods and devices as described above are used in the fabrication and packaging of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of bonding components, the method comprising:
    placing an interposer having solder balls mounted thereto in a first jig, the first jig having a plurality of slots, the plurality of slots being configured to receive at least one of the solder balls;
    applying force to the interposer using the first jig such that an initial degree of warpage in the interposer is decreased;
    then mounting a device on the interposer, thereby forming a stack;
    transferring the stack from the first jig to a first chamber, wherein the first chamber comprises a bracket for receiving the solder balls of the interposer; and
    applying heat and pressure to the stack, thereby bonding the device to the interposer.

2. The method of claim 1,
    wherein the device comprises an integrated circuit, and
    wherein bonding the device to the interposer utilizes at least one of a furnace reflow process and a thermal compression bonding process while the initial degree of warpage of the interposer is decreased.

3. The method of claim 1, the method further comprising:
    forming the one or more bonds between the interposer and a first component using a process that reflows one or more solder balls of the interposer such that the one or more solder balls of the interposer are bonded to one or more electrical connections of the first component, wherein the bracket is located, at least in part, between the interposer and the first component and thereby limits a reduction of the distance between the interposer and the first component during formation of the one or more bonds between the interposer and the first component.

4. The method of claim 2, wherein the integrated circuit is bonded to the interposer such that one or more quantities of solder of the integrated circuit are bonded to one or more electrical connections of the interposer.

5. The method of claim 3, wherein the first component is an organic laminate with one or more electrical connections that align with one or more solder balls of the interposer.

6. The method of claim 1, wherein applying force to the interposer, using the first jig such that the initial degree of warpage is decreased, increases internal strain of the interposer.

7. The method of claim 1,
    wherein the first jig is configured to apply a vacuum to one side of the interposer such that the initial degree of warpage in the interposer is decreased.

8. A method of bonding components, the method comprising:
    placing an interposer having solder balls mounted thereto in a first jig, the first jig having a plurality of slots, the plurality of slots being configured to receive at least one of the solder balls;
    applying force to the interposer using the first jig such that an initial degree of warpage in the interposer is decreased;
    then mounting an integrated circuit on the interposer, thereby forming a stack;

transferring the stack from the first jig to a first chamber such that the interposer is between the integrated circuit and an organic laminate, the first chamber comprising ii) a bracket for receiving the solder balls of the interposer, and ii) the organic laminate; and applying heat and pressure to the stack, thereby bonding the interposer to the integrated circuit and the organic laminate.

9. The method of claim 8,
wherein bonding the integrated circuit to the interposer utilizes at least one of a furnace reflow process and a thermal compression bonding process while the initial degree of warpage of the interposer is decreased.

10. The method of claim 8, the method further comprising:
forming the one or more bonds between the interposer and the organic laminate using a process that reflows one or more solder balls of the interposer such that the one or more solder balls of the interposer are bonded to one or more electrical connections of the organic laminate, wherein the bracket is located, at least in part, between the interposer and the organic laminate and thereby limits a reduction of the distance between the interposer and the organic laminate during formation of the one or more bonds between the interposer and the organic laminate.

11. The method of claim 8, wherein the integrated circuit is bonded to the interposer such that one or more quantities of solder of the integrated circuit are bonded to one or more electrical connections of the interposer.

12. The method of claim 8, wherein the organic laminate includes one or more electrical connections that align with one or more solder balls of the interposer.

13. The method of claim 8, wherein applying force to the interposer, using the first jig such that the initial degree of warpage is decreased, increases internal strain of the interposer.

14. The method of claim 8,
wherein the first jig is configured to apply a vacuum to one side of the interposer such that the initial degree of warpage in the interposer is decreased.

15. The method of claim 8, the method comprising:
forming one or more electrical connections between the organic laminate and the integrated circuit, wherein applying both heat and pressure to a stack of components causes a reflow of one or both of one or more solder balls of the integrated circuit and one or more solder balls of the interposer.

16. The method of claim 8, wherein the organic laminate is a printed circuit board.

17. A method of bonding components, the method comprising:
placing an interposer having solder balls mounted thereto in a first jig, the first jig having a plurality of slots, the plurality of slots being configured to receive at least one of the solder balls;

applying force to the interposer using the first jig such that an initial degree of warpage in the interposer is decreased;

then mounting an integrated circuit on the interposer, thereby forming a stack, wherein the integrated circuit includes a plurality of solder balls that are aligned with a plurality of electrical contacts of the interposer;

transferring the stack from the first jig to a first chamber such that the interposer is between the integrated circuit and a printed circuit board, the first chamber comprising ii) a bracket for receiving the solder balls of the interposer, and ii) the printed circuit board, wherein a plurality of electrical contacts of the printed circuit board are aligned with a plurality of solder balls of the interposer; and applying heat and pressure to the stack, thereby bonding the interposer to the integrated circuit and the printed circuit board, wherein applying both heat and pressure to the stack of components causes a reflow of one or more solder balls of the integrated circuit and one or more solder balls of the interposer such that one or more electrical connections are formed between the integrated circuit and the printed circuit board, wherein the bracket is located, at least in part, between the interposer and the printed circuit board and thereby limits a reduction of the distance between the interposer and the printed circuit board during bond formation between the interposer and the printed circuit board.

18. The method of claim 17, the method further comprising:
wherein bonding the integrated circuit to the interposer utilizes at least one of a furnace reflow process and a thermal compression bonding process while the initial degree of warpage of the interposer is decreased.

19. The method of claim 17, wherein applying force to the interposer using the first jig such that the initial degree of warpage is decreased results in an increase in internal strain of the interposer.

20. The method of claim 17,
wherein the first jig is configured to apply a vacuum to one side of the interposer such that the initial degree of warpage in the interposer is decreased.

* * * * *